United States Patent
Han et al.

(10) Patent No.: US 8,053,889 B2
(45) Date of Patent: Nov. 8, 2011

(54) SEMICONDUCTOR MODULE

(75) Inventors: Seong-chan Han, Cheonan-si (KR);
Dong-woo Shin, Cheonan-si (KR);
Hyun-jong Oh, Seoul (KR); Nam-yong Oh, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 185 days.

(21) Appl. No.: 12/457,522

(22) Filed: Jun. 15, 2009

(65) Prior Publication Data

US 2009/0310313 A1    Dec. 17, 2009

(30) Foreign Application Priority Data

Jun. 13, 2008   (KR) .................. 10-2008-0055835

(51) Int. Cl.
*H01L 23/34* (2006.01)
*H05K 7/10* (2006.01)
(52) U.S. Cl. ......... 257/718; 257/723; 361/719; 361/769
(58) Field of Classification Search .................. 257/678, 257/712, 718, 723, 685, E25.005, E25.011, 257/E25.015, E25.016, E25.02, E25.023, 257/E25.026; 361/719, 769
See application file for complete search history.

(56) References Cited

U.S. PATENT DOCUMENTS

| 6,061,243 | A  | * | 5/2000  | Barnett et al. ............... 361/704 |
| 6,501,658 | B2 | * | 12/2002 | Pearson et al. ............... 361/709 |
| 7,119,436 | B2 | * | 10/2006 | Lien .............................. 257/723 |

FOREIGN PATENT DOCUMENTS

| JP | 2004-140195    | 5/2004 |
| KR | 10-2006-0025759 | 3/2006 |
| KR | 10-2007-0027189 | 3/2007 |

* cited by examiner

*Primary Examiner* — Jasmine Clark
(74) *Attorney, Agent, or Firm* — Harness, Dickey & Pierce, P.L.C.

(57) ABSTRACT

A semiconductor module including a module body and a shock absorbing member on an exposed surface of the module body is provided. The module body may include at least one semiconductor package on a substrate and the exposed surface of the module body may include exposed surfaces of the substrate and the at least one semiconductor package. In accordance with example embodiments, the module body may also include a heat transfer member on the at least one semiconductor package and an exposed surface of the module body may include an exposed surface of the heat transfer member.

17 Claims, 6 Drawing Sheets

SEMICONDUCTOR MODULE

PRIORITY STATEMENT

This application claims priority under 35 U.S.C. §119 to Korean Patent Application No. 10-2008-0055835, filed on Jun. 13, 2008, in the Korean Intellectual Property Office (KIPO), the entire contents of which are herein incorporated by reference.

BACKGROUND

1. Field

Example embodiments relate to a semiconductor module, and more particularly, to a semiconductor module which may reduce solder joint crack (SJC) defects due to a shock received during the manufacture or use thereof. The semiconductor module may be used in a semiconductor memory module formed of a ball grid array (BGA) package.

2. Description of the Related Art

In general, a plurality of semiconductor chips may be formed on a wafer in a semiconductor manufacturing process. The semiconductor chips may be separated from the wafer in a sawing process and manufactured into a semiconductor package in a packaging process. The semiconductor package may be mounted on a circuit substrate having a circuit pattern and manufactured into a semiconductor module.

A BGA package structure, in which a solder ball instead of a lead frame, is installed on a surface of a semiconductor package, is widely used for its high capacity, high integration, and high speed. Because the capacity, integration, and speed of the semiconductor package increase, generation of heat increases so that a heat transfer member, for example, a heat sink, is employed in the semiconductor package to solve the heat generation problem.

The additional installation of the heat transfer member may increase the weight per unit product of the semiconductor package. Due to the solder ball's relatively low resistance to shock, a conventional semiconductor module may be prone to damage in the event the module is dropped due to the user's careless handling. The module is also prone to damage due to shocks generated during the manufacture or use thereof. Furthermore, because the space for installation of the semiconductor module decreases, there are limits in installing separate protection apparatuses to protect the semiconductor module.

SUMMARY

Example embodiments provide a semiconductor module with improved shock resistance. The semiconductor module may be used in a semiconductor memory module formed of a ball grid array (BGA) package.

However, example embodiments are not limited to the ones set forth herein. The above and other features and advantages of example embodiments will become more apparent to one of ordinary skill in the art to which example embodiments pertain by referencing a detailed description of example embodiments below.

In accordance with example embodiments, a semiconductor module may include a module body and a shock absorbing member on an exposed surface of the module body. The module body may include at least one semiconductor package on a substrate and the exposed surface of the module body may include exposed surfaces of the substrate and the at least one semiconductor package. In accordance with example embodiments, the module body may also include a heat transfer member on the at least one semiconductor package and the exposed surface of the module body may include an exposed surface of the heat transfer member.

BRIEF DESCRIPTION OF THE DRAWINGS

Example embodiments will be more clearly understood from the following detailed description taken in conjunction with the accompanying drawings.

FIG. 1 is a plan view of a semiconductor module according to example embodiments;

FIG. 2 is a plan view of a semiconductor module according to example embodiments;

FIG. 3 is a plan view of a semiconductor module according to example embodiments;

FIG. 4 is a plan view of a plurality of the semiconductor modules of FIG. 1 that are installed close to one another;

FIG. 5 is a perspective view of FIG. 1;

FIG. 6 is a perspective view of a semiconductor module according to example embodiments;

FIG. 7 is a partially enlarged perspective view of an example shock absorbing member of FIG. 1;

FIG. 8 is a partially enlarged perspective view of an example shock absorbing member of FIG. 7;

FIG. 9 is a partially enlarged perspective view of an example shock absorbing member of FIG. 7;

FIG. 10 is a partially enlarged perspective view of an example shock absorbing member of FIG. 7;

FIG. 11 is a plan view of a semiconductor module including a shock absorbing member disposed on two semiconductor packages in accordance with example embodiments;

FIG. 12 is a plan view of a semiconductor module including a shock absorbing member disposed on a semiconductor package and a circuit substrate in accordance with example embodiments;

FIG. 13 is a plan view of a semiconductor module including a cover in accordance with example embodiments; and FIG. 14 is a plan view of a semiconductor module including a cover in accordance with example embodiments.

DETAILED DESCRIPTION OF EXAMPLE EMBODIMENTS

Figure 1:
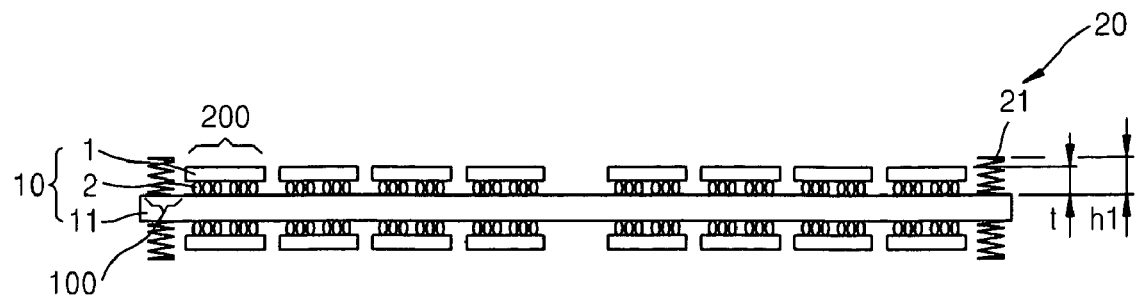
FIGS. 1-14 represent non-limiting, example embodiments as described herein.

Example embodiments will now be described more fully with reference to the accompanying drawings, in which example embodiments are shown. Example embodiments may, however, be embodied in different forms and should not be construed as limited to the embodiments set forth herein. Rather, these embodiments are provided so that this disclosure will be thorough and complete, and will fully convey the scope of example embodiments to those skilled in the art. In the drawings, the sizes of components may be exaggerated for clarity.

It will be understood that when an element or layer is referred to as being "on", "connected to", or "coupled to" another element or layer, it can be directly on, connected to, or coupled to the other element or layer or intervening elements or layers that may be present. In contrast, when an element is referred to as being "directly on", "directly connected to", or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. Thus, a first element, component, region, layer, or section discussed below could be termed a second element, component, region, layer, or section without departing from the teachings of example embodiments.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments described herein will refer to plan views and/or cross-sectional views by way of ideal schematic views. Accordingly, the views may be modified depending on manufacturing technologies and/or tolerances. Therefore, example embodiments are not limited to those shown in the views, but include modifications in configuration formed on the basis of manufacturing processes. Therefore, regions exemplified in figures have schematic properties and shapes of regions shown in figures exemplify specific shapes or regions of elements, and do not limit example embodiments.

Figure 5:
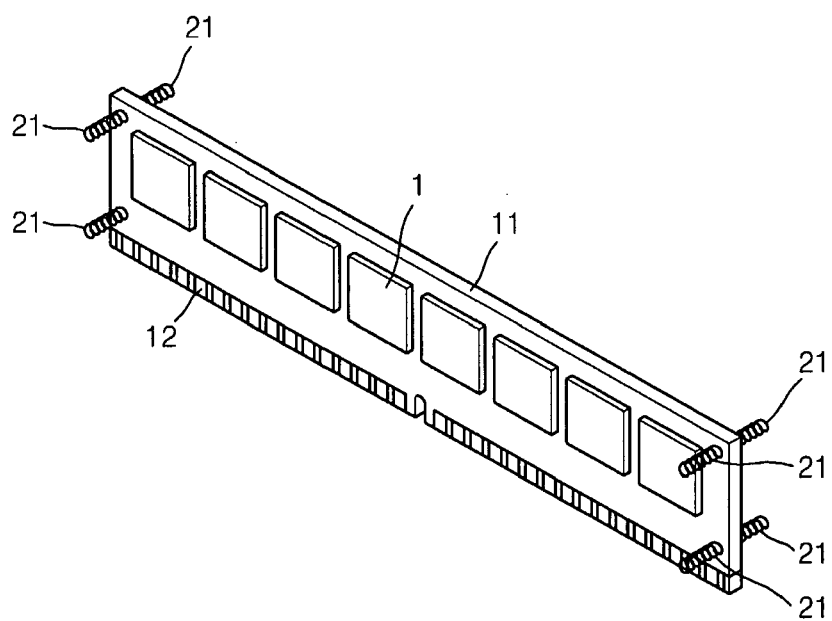
Figure 7:
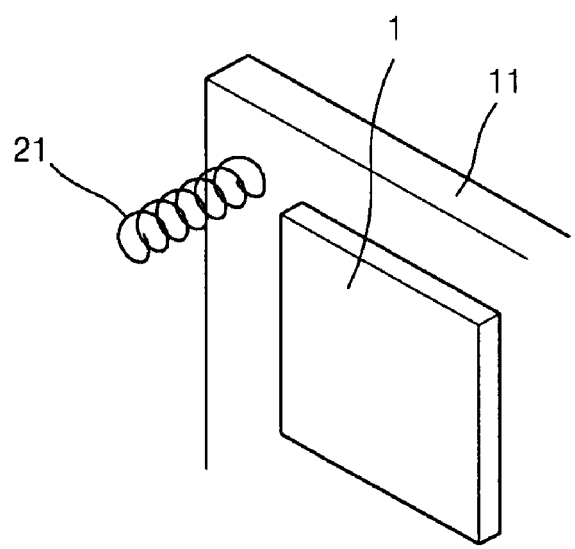

FIG. 1 is a plan view of a semiconductor module according to example embodiments. FIG. 5 is a perspective view of FIG. 1. FIG. 7 is a partially enlarged perspective view of an example shock absorbing member of FIG. 1.

Figure 2:
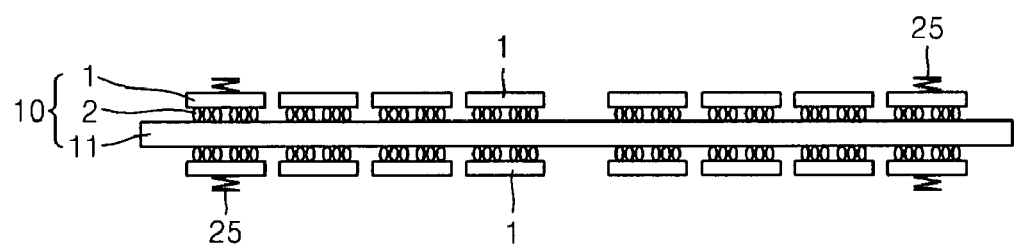

Referring to FIGS. 1, 2, 5, and 7, a semiconductor module according to example embodiments may include a module body 10 and a shock absorbing member 20 installed on the module body 10. As shown in FIG. 1, the module body 10 may include a circuit substrate 11 and a semiconductor package 1. As shown in FIGS. 1 and 2, the shock absorbing member 20 may be installed on exposed surfaces 100 and 200 of the circuit substrate 11 and the semiconductor package 1 which may constitute an exposed surface of the module body. The circuit board 11 may have a thin rectangular plate shape and a connection terminal 12 that may be inserted in a memory slot (not shown) of a computer. As shown in FIG. 5, the terminal 12 may be installed on a lower side of the circuit board 11. The semiconductor package 1 may be a ball grid array (BGA) package in which a plurality of solder balls 2 are formed on a surface of the semiconductor package 1.

The semiconductor package 1 may be applied to a variety of types of semiconductor package devices, for example, microprocessors and/or memories. A plurality of the semiconductor packages 1, for example, a total of sixteen semiconductor packages as shown in the drawings, may be parallel installed on both surfaces of the circuit board 11 to improve performance and increase integration.

The shock absorbing member 20 according to example embodiments may be installed on a side of the module body 10 that is expected to collide with a collision object so that the semiconductor package 1 may be protected from shock applied to the module body 10. The shock, for example, may be due to careless handling. As shown in FIG. 1, the shock absorbing member 20 may have a height h1 that is at least greater than the thickness t of the semiconductor package 1. Accordingly, when the semiconductor module is shocked, for example, by being dropped or by being carelessly handled, the shock absorbing member 20 may contact a collision object earlier than the semiconductor package 1.

Figure 3:
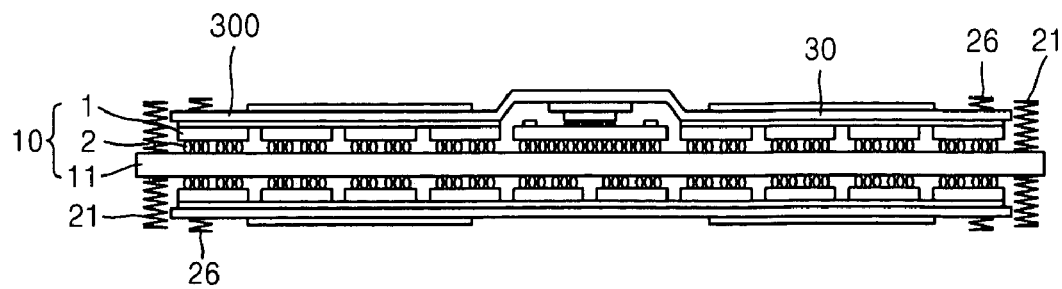
Figure 4:
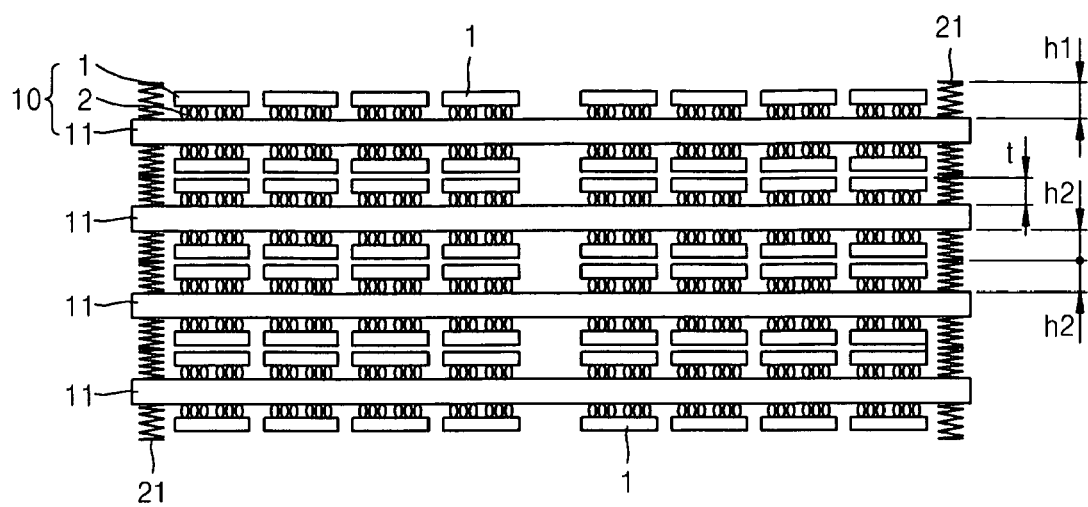

FIG. 4 is a plan view of a plurality of the semiconductor modules of FIG. 1 that are installed close to one another. When there is no binding force, for example, when the semiconductor according to example embodiments is not yet installed in a computer, the shock absorbing member 20 has the height h1 that is greater than the thickness t of the semiconductor package 1, as shown in FIG. 1. When there is a binding force, for example, when the semiconductor according to example embodiments is manually installed in a computer by a worker, the shock absorbing member 20 may be compressed such that a height h2 of the shock absorbing member 20 may be greater than, the same as, or less than the thickness t of the semiconductor package 1, being installed adjacent to other neighboring semiconductor modules. In particular, as shown in FIGS. 1-7, the shock absorbing member 20 may be a coil spring 21 capable of being elastically compressed.

Figure 6:
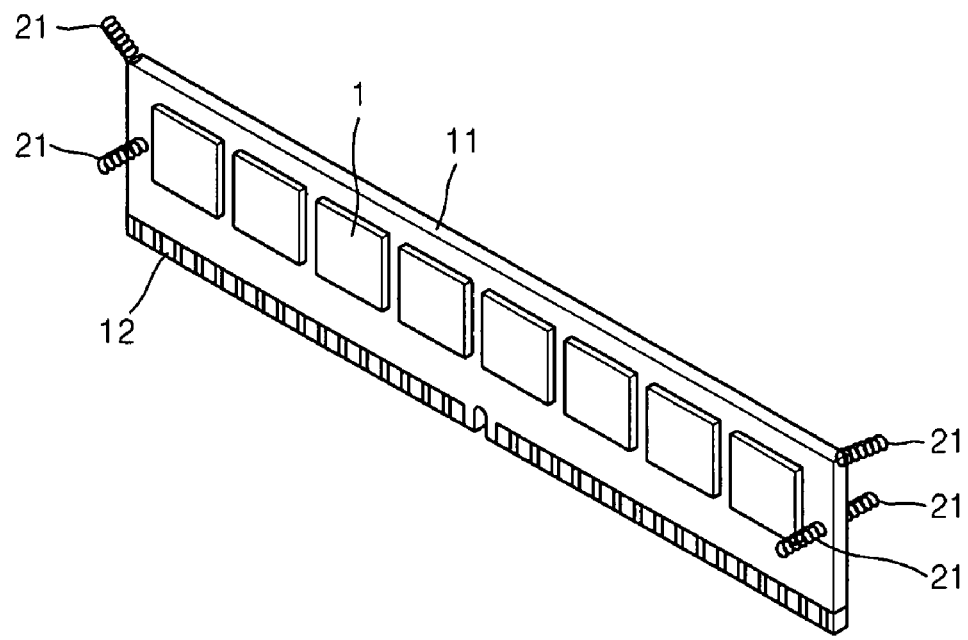

FIG. 6 is a perspective view of a semiconductor module according to example embodiments. Referring to FIG. 6, the coil spring 21, a type of the shock absorbing member 20, may be installed on each corner of both sides and on an upper edge of each corner. As described above, the height h1, the installation position, and the number of the shock absorbing members 20 may be properly set considering various cases for when a semiconductor module is shocked. For example, when the shock is due to being dropped on a floor, the shock absorbing member 20 may be set so that the semiconductor package 1 does not collide directly against the floor. Additionally, the shock absorbing members 20 may be set so that the shock absorbing member 20 first collides against the floor or only the shock absorbing members 20 collide against the floor. Thus, when the semiconductor module is dropped on the floor, an impact force due to the collision against a floor surface may not be transferred directly to the semiconductor package and may be absorbed and/or eliminated by the coil spring 21 that collides first.

FIG. 2 is a plan view of a semiconductor module according to example embodiments. Referring to FIG. 2, a coil spring 25, which is the shock absorbing member 20, may be installed on a surface of each of the semiconductor package 1. For example, the coil spring 25 may be installed on the leftmost position and the semiconductor package 1 may be installed on the rightmost position on a surface of the module body 10. Therefore, when the semiconductor module is shocked due to the semiconductor module being dropped on a floor, the impact force due to the collision against the floor surface may not be directly transferred to the semiconductor package 1, but may be absorbed and/or eliminated by the coil spring 25 that collides first. Also, high temperature heat energy radiated in the semiconductor package 1 may be dissipated through the coil spring 25.

As shown in FIG. 3, the module body 10 may further include a heat transfer member 30. A coil spring 26, which is a type of the shock absorbing member 20, may be installed on either end portions of both sides of the heat transfer member 30. As shown in FIG. 3, the coil springs 26 may be installed on an exposed surface 300 of the heat transfer member 30 which may constitute an exposed surface of the module body 10. Thus, when the semiconductor module is shocked, for example, by being dropped, the coil spring 26 may work as a shock absorbing device so that the semiconductor package 1 and both of the heat transfer member 30 may be protected.

Figure 8:
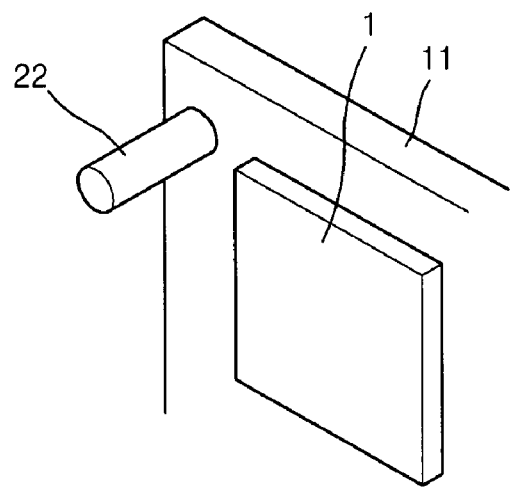
Figure 9:
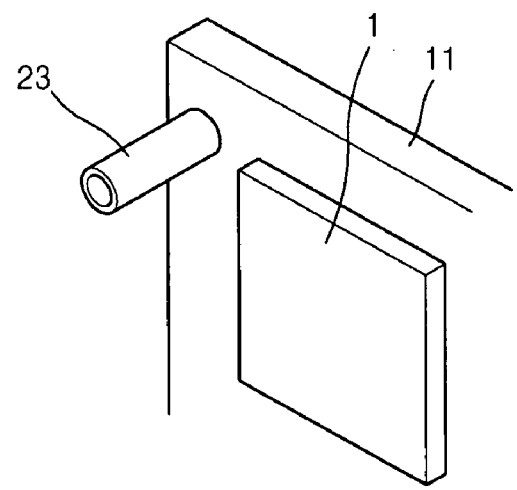
Figure 10:
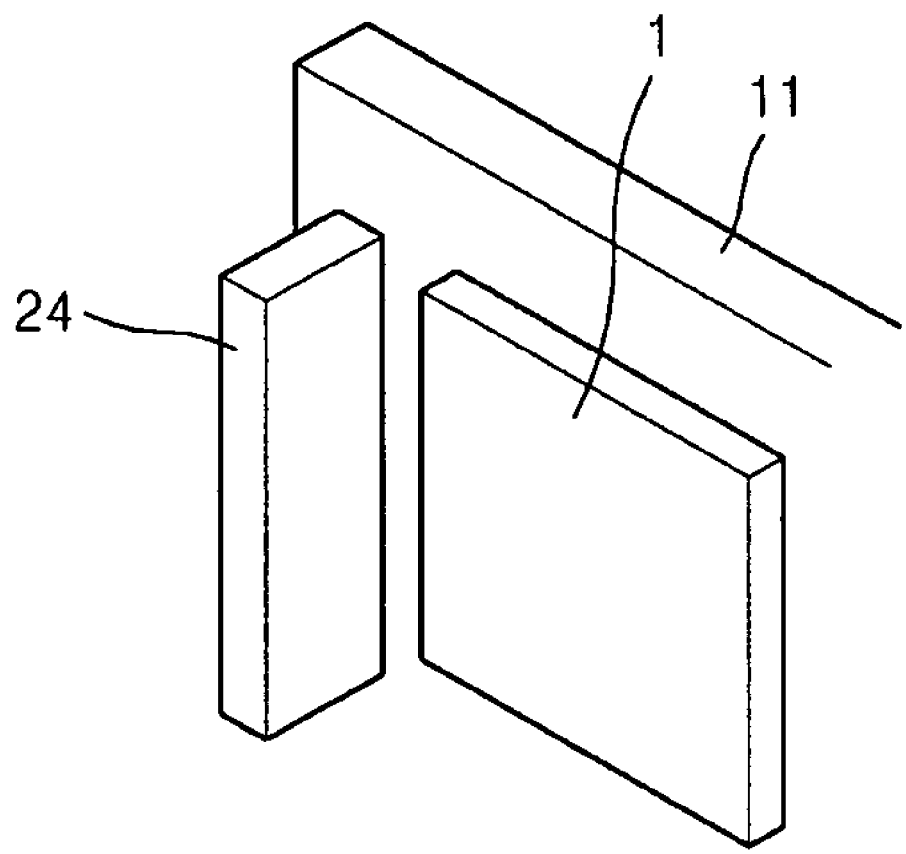

When being mounted on the module body 10, the shock absorbing member 20 may be installed on the module body 10 in a variety of methods, for example, welding or adhesion. In addition to the coil spring 21 of FIG. 7, a variety of the shock absorbing devices having different shapes may be employed as the shock absorbing member 20. For example, a resin elastic member, e.g., a circular column shaped absorbing member 22 as shown in FIG. 8, a pipe shaped absorbing member 23 as shown in FIG. 9, or a polyhedral absorbing member 24 as shown in FIG. 10, may be employed.

Figure 11:
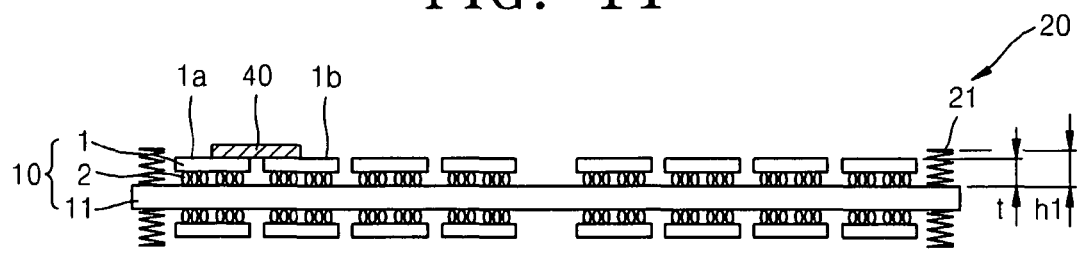
Figure 12:
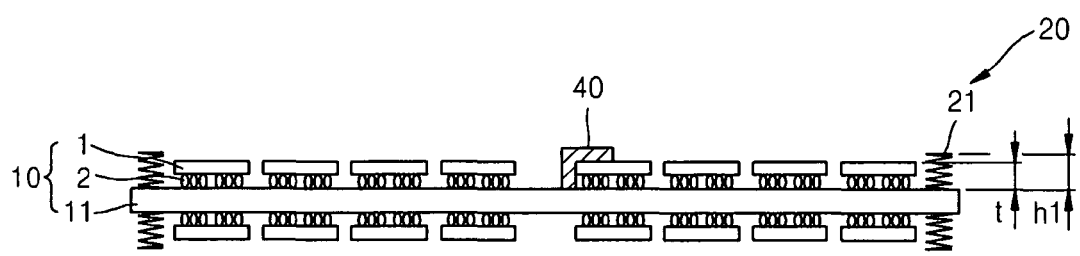

Although individual shock absorbing members 20 disclosed above are illustrated as being attached to only a single semiconductor package 1 and/or a circuit substrate 11, example embodiments are not limited thereto. For example, a shock absorbing member 40 may be provided on two separate semiconductor packages 1a and 1b, as shown in FIG. 11 or may be provided on the circuit substrate 11 and a semiconductor package 1 as shown in FIG. 12. These configurations allow for broader shock protection which may be important in the event a force generated by shocking is applied at a location offset from a predicted point of shock. Additionally, providing a shock absorbing member 40 over a larger area may spread a shocking force over the larger area thereby reducing the overall stress applied to the semiconductor package 1 and/or the circuit substrate 11.

Figure 13:
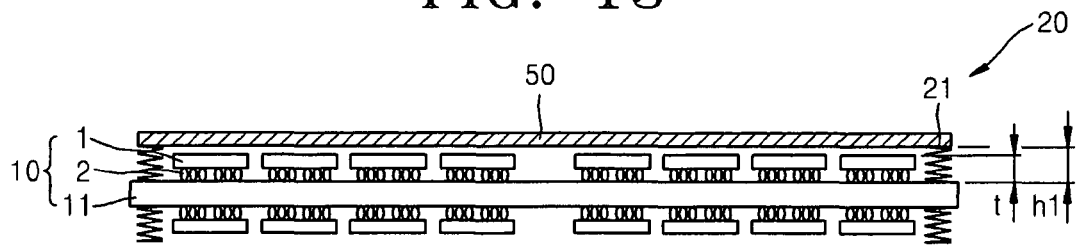

The shock absorbing members 20 may also be connected to a cover covering the semiconductor module. As shown in FIG. 13, a cover 50, for example, a thin plate, may be attached to the shock absorbing members 20 to cover the semiconductor package 1 and the circuit substrate 11. The cover may help protect the semiconductor module body 10 in the event a force, due to shock, was applied at a position between shock absorbing members 20.

Figure 14:
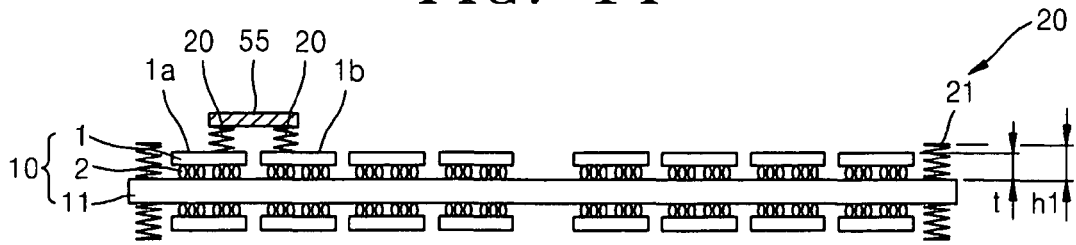

Although the cover 50 illustrated in FIG. 13 covers the length of the semiconductor module, a shorter cover may be provided for localized protection. For example, as shown in FIG. 14, a cover 55 may be provided on two adjacent semiconductor packages 1a and 1b. This configuration helps protect the semiconductor packages 1a and 1b against shock in the event a force, due to shock, was applied between the centers of adjacent semiconductor packages. Additionally, the cover 55 may spread a shock force to two different shock absorbing members 20, rather than a single shock absorbing member, thereby reducing the overall stress applied to a single shock absorbing member 20 or semiconductor package 1.

While example embodiments has been particularly shown and described with reference to exemplary embodiments thereof, it will be understood by those skilled in the art that various changes in form and details may be made therein without departing from the spirit and scope of example embodiments as defined by the appended claims.

What is claimed is:

1. A semiconductor module comprising:
    a module body, the module body including at least one semiconductor package on a substrate and an exposed surface of the module body includes at least one of an exposed surface of the substrate and the at least one semiconductor package; and
    a shock absorbing member on the exposed surface of the module body, wherein the shock absorbing member is on at least one of the at least one semiconductor package and the substrate by welding or adhesion.

2. The semiconductor module of claim 1, wherein the at least one semiconductor package is a ball grid array package.

3. The semiconductor module of claim 1, wherein the shock absorbing member is an elastic member having a height greater than a thickness of the at least one semiconductor package.

4. The semiconductor module of claim 1, wherein the shock absorbing member is an elastic member configured to have a height greater than a thickness of the at least one semiconductor package when there is no force applied to the shock absorbing member and configured to deform to a height that is greater than, the same as, or less than the thickness of the at least one semiconductor package when there is a force applied to the shock absorbing member.

5. The semiconductor module of claim 1, wherein the shock absorbing member is a coil spring.

6. The semiconductor module of claim 1, wherein the shock absorbing member is an elastic member formed of resin and has one of a circular column shape, a pipe shape, a hexahedral shape, and a polyhedral shape.

7. The semiconductor module of claim 1, wherein the substrate is a thin plate shaped circuit board having a connection terminal on a side thereof and the at least one semiconductor package is on a surface or both surfaces of the circuit board.

8. The semiconductor module of claim 7, wherein the shock absorbing member is on one corner of the circuit board.

9. The semiconductor module of claim 7, wherein the shock absorbing member is between the corners of the circuit board.

10. The semiconductor module of claim 7, wherein the shock absorbing member is on one edge of the circuit board.

11. The semiconductor module of claim 7, wherein the shock absorbing member is on the at least one semiconductor package.

12. The semiconductor module of claim 1, wherein the shock absorbing member is on the at least one semiconductor package and the substrate.

13. The semiconductor module of claim 1, wherein the at least one semiconductor package includes at least two adjacent semiconductor packages and the shock absorbing member is on the two adjacent semiconductor packages.

14. A semiconductor module comprising:
    a module body, the module body including at least one semiconductor package on a substrate and an exposed surface of the module body includes at least one of an exposed surface of the substrate and the at least one semiconductor package; and
    a shock absorbing member on the exposed surface of the module body, wherein the module body further includes a heat transfer member on the at least one semiconductor package and the exposed surface of the module body also includes an exposed surface of the heat transfer member and wherein the shock absorbing member is on an exposed surface of the heat transfer member.

15. A semiconductor module comprising:
    a module body, the module body including at least one semiconductor package on a substrate and an exposed surface of the module body includes at least one of an exposed surface of the substrate and the at least one semiconductor package;
    a shock absorbing member on the exposed surface of the module body; and
    a plate over the substrate such that the shock absorbing member is between the plate and the substrate.

16. The semiconductor module of claim 15, wherein the plate covers the substrate.

17. The semiconductor module of claim 15, wherein the plate partially covers the substrate.

* * * * *